United States Patent
Schultz et al.

(10) Patent No.: US 9,570,373 B1
(45) Date of Patent: Feb. 14, 2017

(54) NEAR-CHIP COMPLIANT LAYER FOR REDUCING PERIMETER STRESS DURING ASSEMBLY PROCESS

(71) Applicant: International Business Machines Corporation, Armonk, NY (US)

(72) Inventors: Mark D. Schultz, Ossining, NY (US); Todd E. Takken, Brewster, NY (US); Shurong Tian, Mount Kisco, NY (US); Yuan Yao, Tarrytown, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/963,466

(22) Filed: Dec. 9, 2015

(51) Int. Cl.
*H01L 23/367* (2006.01)
*H01L 25/00* (2006.01)
*H01L 25/065* (2006.01)
*H01L 25/10* (2006.01)
*H01L 21/48* (2006.01)
*H01L 23/34* (2006.01)

(52) U.S. Cl.
CPC ......... *H01L 23/3675* (2013.01); *H01L 21/481* (2013.01); *H01L 21/4882* (2013.01); *H01L 23/345* (2013.01); *H01L 25/0655* (2013.01); *H01L 25/105* (2013.01); *H01L 25/50* (2013.01)

(58) Field of Classification Search
CPC .... H01L 23/34; H01L 23/3672; H01L 23/367; H01L 21/4882; H01L 23/345
See application file for complete search history.

(56) References Cited

U.S. PATENT DOCUMENTS

| 5,296,739 | A  | 3/1994  | Heilbronner |
| 7,629,684 | B2 | 12/2009 | Alcoe       |
| 7,872,344 | B2 | 1/2011  | Fjelstad    |
| 8,338,925 | B2 | 12/2012 | Fjelstad    |
| 8,736,048 | B2 | 5/2014  | Schultz     |
| 8,779,578 | B2 | 7/2014  | Leigh       |

(Continued)

FOREIGN PATENT DOCUMENTS

KR  1020050013403 A  2/2005

OTHER PUBLICATIONS

Ansys, Inc., Structural Analysis Solutions—ANSYS, Downloaded From http://www.ansys.com/Products/Simulation+Technology/Structural+Analysis on Dec. 9, 2015, p. 1.

(Continued)

*Primary Examiner* — Alonzo Chambliss
(74) *Attorney, Agent, or Firm* — Daniel P. Morris; Otterstedt, Ellenbogen & Kammer, LLP

(57) ABSTRACT

A heat source (single semiconductor chip or group of closely spaced semiconductor chips of similar height) is provided on a first side of a substrate, which substrate has on said first side a support member comprising a compressible material. A heat removal component, oriented at an angle to said heat source, is brought into proximity of said heat source such that said heat removal component contacts said support member prior to contacting said heat source. Said heat removal component is assembled to said heat source such that said support member at least partially absorbs global inequality of force that would otherwise be applied to said heat source, absent said support member comprising said compressible material.

9 Claims, 4 Drawing Sheets

(56) References Cited

U.S. PATENT DOCUMENTS

| | | | |
|---|---|---|---|
| 2005/0127500 A1 | 6/2005 | Colgan | |
| 2008/0128897 A1* | 6/2008 | Chao | H01L 23/10 257/713 |
| 2008/0225484 A1* | 9/2008 | Brodsky | H01L 23/42 361/699 |
| 2011/0018125 A1* | 1/2011 | Loo | H01L 23/16 257/706 |
| 2012/0098118 A1* | 4/2012 | Lin | H01L 21/563 257/713 |
| 2012/0182694 A1* | 7/2012 | Lin | H01L 23/055 361/715 |
| 2013/0027870 A1 | 1/2013 | Goldrian et al. | |
| 2016/0005682 A1* | 1/2016 | Leal | H01L 24/32 257/675 |

OTHER PUBLICATIONS

MSC Software Corporation, MSC Nastran—Multidisciplinary Structural Analysis, Downloaded From http://www.mscsoftware.com/product/msc-nastran on Dec. 9, 2015, pp. 1-2.

\* cited by examiner

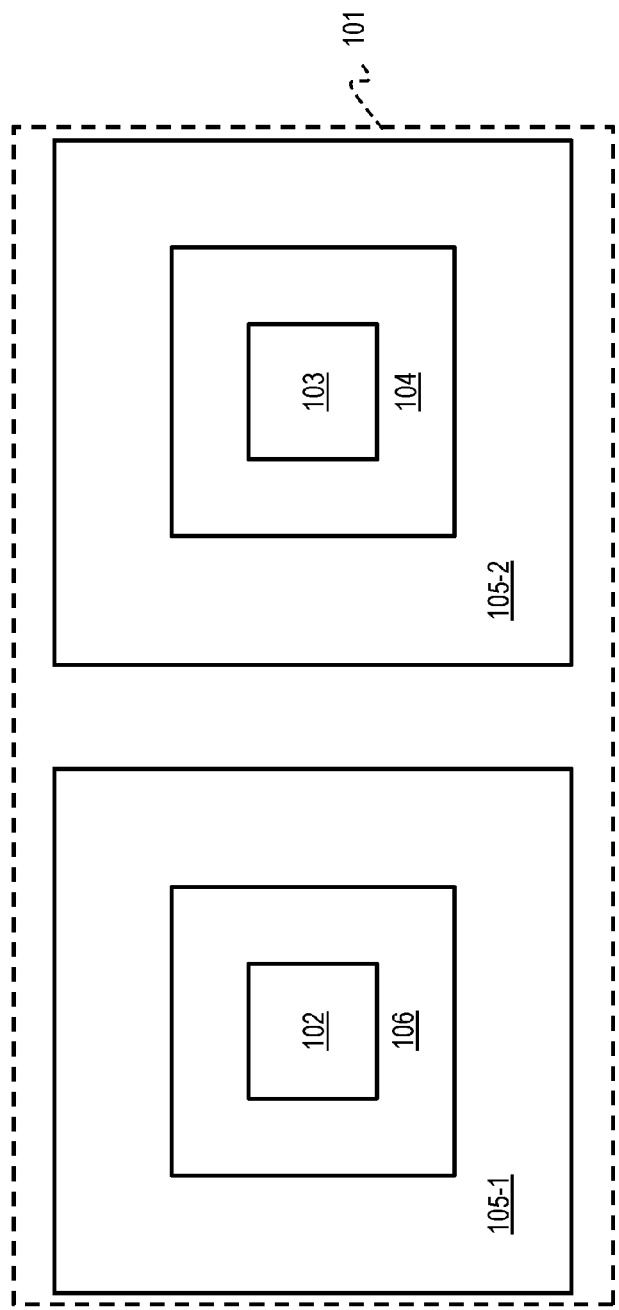
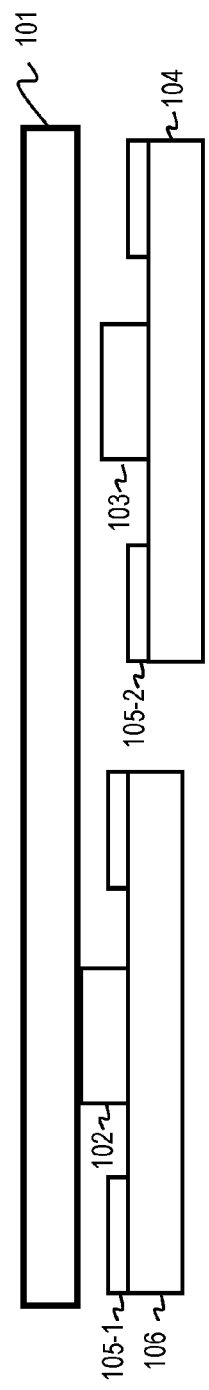

NEAR-CHIP COMPLIANT LAYER FOR REDUCING PERIMETER STRESS DURING ASSEMBLY PROCESS

STATEMENT OF GOVERNMENT RIGHTS

This invention was made with Government support under Contract No.: B604142 awarded by the Department of Energy. The Government has certain rights in this invention.

CROSS-REFERENCE TO RELATED APPLICATIONS

Not Applicable.

FIELD OF THE INVENTION

The present invention relates to the electrical, electronic, computer, and mechanical arts, and, more particularly, to electronic packaging technology and the like.

BACKGROUND OF THE INVENTION

In high performance electronic computing systems, the heat-generating active components need to be cooled in order to keep the component temperatures within acceptable limits. Heat is removed from a processor die made from silicon or other material by contacting the face of the die with a thermal sink through a first thermal interface material (TIM1). In most applications, this thermal sink is a module lid or heat spreader, in which case a second thermal interface material (TIM2) is used to make contact with a liquid-cooled cold plate or air-cooled heat sink.

In other applications referred to as "bare die attach," the cold plate or air-cooled heat sink is contacted directly to the heat generating chip through the TIM1, and the TIM2 is eliminated. In all cases, the processor die will have a limit on the maximal local force which it can tolerate before being damaged. Most systems limit the local force by using a mechanically compliant TIM1 to even out the force seen by the die. Bare die attach with no TIM2 is used when better thermal performance is required. For cases where a stiffer or thinner TIM1 is desired to further improve thermal performance, a flexible cold plate or heat sink can be used.

Such existing methods can do a good job of reducing local force inequalities applied to the processor die, when a single thermal sink is contacted to a single chip or a single group of closely spaced chips of relatively uniform height.

SUMMARY OF THE INVENTION

Principles of the invention provide techniques for a near-chip compliant layer for reducing perimeter stress during the assembly process. In one aspect, an exemplary method includes the step of providing a heat source on a first side of a substrate. Said substrate has on said first side a support member comprising a compressible material. Said heat source includes one of a single semiconductor chip; and a group of closely spaced semiconductor chips of similar height. A further step includes bringing into proximity of said heat source a heat removal component, oriented at an angle to said heat source, such that said heat removal component contacts said support member comprising said compressible material prior to contacting said heat source. An even further step includes assembling said heat removal component to said heat source such that said support member comprising said compressible material at least partially absorbs global inequality of force that would otherwise be applied to said heat source, absent said support member comprising said compressible material.

In another aspect, an exemplary system includes a semiconductor module, in turn including a substrate having a first side; a heat source on said first side of said substrate; and a support member. The support member includes a compressible material, located on said first side of said substrate. The heat source comprises one of a single semiconductor chip; and a group of closely spaced semiconductor chips of similar height. Also included is a heat removal component, disposed opposite said first side of said substrate and in contact with said compressible material.

In still another aspect, an exemplary semiconductor module includes a substrate having a first side; and a heat source on said first side of said substrate. Said heat source in turn includes one of a single semiconductor chip; and a group of closely spaced semiconductor chips of similar height. Also included is a support member, comprising a compressible material, located on said first side of said substrate.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

Techniques of the present invention can provide substantial beneficial technical effects. For example, one or more embodiments reduce or eliminate global force inequalities when two or more misaligned integrated circuit chips are contacted with a common heat sink.

These and other features and advantages of the present invention will become apparent from the following detailed description of illustrative embodiments thereof, which is to be read in connection with the accompanying drawings.

BRIEF DESCRIPTION OF THE DRAWINGS

FIGS. 1 and 2 show top and side views respectively of elements including a single heat sink and two separately mounted chips, in accordance with the prior art;

DETAILED DESCRIPTION OF PREFERRED EMBODIMENTS

Figure 3:
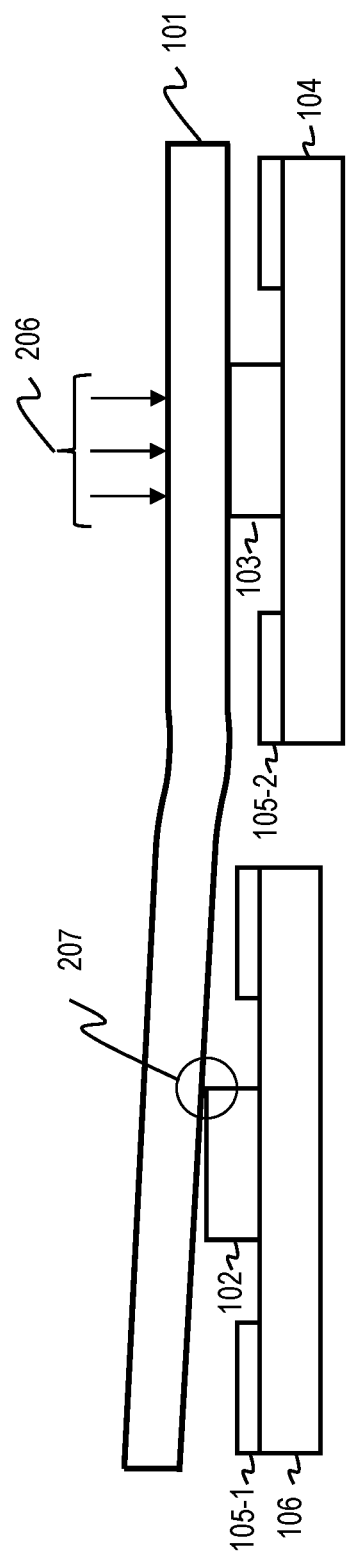
FIG. 3 shows a problem encountered in assembling the prior-art elements of FIGS. 1 and 2.

As noted above, in high performance electronic computing systems, the heat-generating active components need to be cooled in order to keep the component temperatures within acceptable limits. Heat is removed from a processor die made from silicon or other material by contacting the face of the die with a thermal sink through a first thermal interface material (TIM1). In most applications this thermal sink is a module lid or heat spreader, in which case a second thermal interface material (TIM2) is used to make contact with a water-cooled cold plate or air-cooled heat sink. In other applications referred to as "bare die attach," the cold plate or air-cooled heat sink is contacted directly to the heat generating chip through the TIM1, and the TIM2 is eliminated. In all cases, the processor die will have a limit on the maximal local force which it can tolerate before being damaged. Most systems limit the local force by using a mechanically compliant TIM1 to even out the force seen by the die. Bare die attach with no TIM2 is used when better thermal performance is required. For cases where a stiffer or thinner TIM1 is desired to further improve thermal performance, a flexible cold plate or heat sink can be used.

As also noted above, such existing methods can do a good job of reducing local force inequalities applied to the processor die, when a single thermal sink is contacted to a single chip or a single group of closely spaced chips of similar height.

Global force inequalities can still be significant in cases where the thermal sink mates at an angle or where the global force applied to the component is uneven. This could occur when perimeter screws are tightened during mating of an air-cooled heat sink or other thermal sink to a single chip or group of closely spaced chips (generally, a "heat source"). Such global force inequalities can be reduced by using more complex center-loading springs or by requiring a carefully controlled screw torqueing pattern. However, in other cases it may be possible to advantageously reduce cost if multiple heat sources (i.e., multiple chips and/or multiple groups of closely spaced chips) are contacted with a common thermal sink. One example would be when chips on multiple different circuit boards are contacted by a common water-cooled cold plate. Another example is chips on the same support but which are vertically misaligned due to tolerance stack-up, being separate by a significant lateral distance, or the like. Techniques can be used to increase the flexibility of this common thermal sink so that it bends in the regions between the heat sources. However, due to mechanical tolerances in the positions of the different heat sources, the common thermal sink will be likely to contact at least one of these heat sources at an angle. This will apply force unequally to the heat source, with a significant increase in force being applied at a local portion of the perimeter.

For cases where excess perimeter loading is a concern, one or more embodiments employ a mechanically compliant layer in close proximity but outside the main area of the heat source. The compliance of this additional layer allows it to absorb the global inequality of force that would otherwise be applied to the heat source when the thermal sink is initially attached at a slight angle. The perimeter of the heat source therefore experiences much less excess force, thereby protecting it from damage.

One or more embodiments thus advantageously reduce excess mechanical stress applied near the perimeter of a heat generating component during attachment of a thermal sink. A mechanically compliant layer in lateral proximity to the heat generating component absorbs the majority of any global inequality in force applied to one area of a component versus another area, thereby reducing the maximal local force applied to the perimeter of the heat-generating component.

In FIGS. 1 and 2 a common thermal (heat) sink 101 is mated with two heat sources 102 and 103. Please note that the heat sink 101 is shown in dashed lines in the top view of FIG. 1 and the other components are shown in solid lines, even though the heat sink 101 is above the other components as seen in FIG. 2. This is done to allow the features of the other components to be readily appreciated in the top view of FIG. 1.

Due to mechanical tolerances, the heights of these two heat sources 102 and 103 are different. Heat sink 101 can be liquid cooled, air cooled, or work via conduction, and can be made, for example, from copper, aluminum, or the like. Elements 104, 106 are circuit boards or substrates made of, e.g., silicon in the case of a substrate or known materials in the case of a circuit board (e.g., a glass fiber reinforced (fiberglass) epoxy resin substrate with a copper foil bonded on to one or both sides). These are non-limiting examples of materials).

Heat sources 102 and 103 can be, for example, chips that dissipate significant heat. Many systems utilize individual cold plates; i.e., each heat source 102, 103 has its own cold plate (or a cold plate is shared between two or more heat sources which are very close together and not likely to be misaligned). However, in the exemplary case of FIG. 1, it is desired to use multiple chips 102, 103 with a single shared cold plate 101, and as noted, due to mechanical tolerances, the heights (i.e., relative to the cold plate 101) of these two heat sources 102 and 103 are different.

Elements 105-1, 105-2 are frame elements or stiffeners; known substrates and circuit boards have such frame elements or stiffeners today. They are typically made out of metal with good structural properties; e.g., copper, stainless steel, or aluminum (but can be made of any material with adequate structural properties).

Note that the circuit boards or substrates 104, 106 would normally be supported by being soldered onto a motherboard or with a land grid array (LGA). The supporting structures are omitted for clarity. There could be a single support for both but with a large enough spacing that misalignment becomes a problem, or there could be separate supports.

When force 206 is applied in FIG. 3 to the heat sink above one of the heat sources 103, the common thermal sink 101 deforms, applying excess perimeter forces to the other heat source 102 at perimeter location 207. When an attempt is made to assemble the elements, the two circuit boards 104, 106 are not aligned, and accordingly, the top surfaces of the chips 102, 103 are not coplanar. Therefore, the left-hand heat source 102 is contacting the cold plate 101 before the cold plate makes contact with the right-hand heat source 103. As force 206 is being applied on the right, the point contact at 207 introduces stress into the heat source 102.

Figure 4:
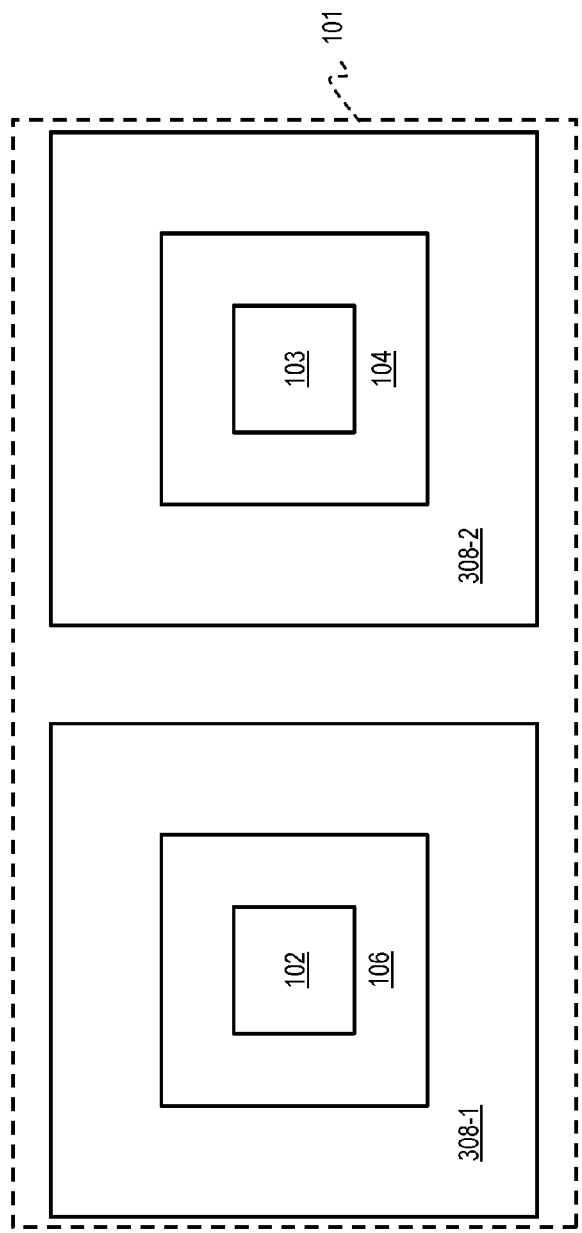
FIGS. 4 and 5 show top and side views respectively of elements including a single heat sink and two separately mounted chips, as well as a near-chip compliant layer for reducing perimeter stress during assembly, in accordance with an aspect of the invention.
Figure 5:
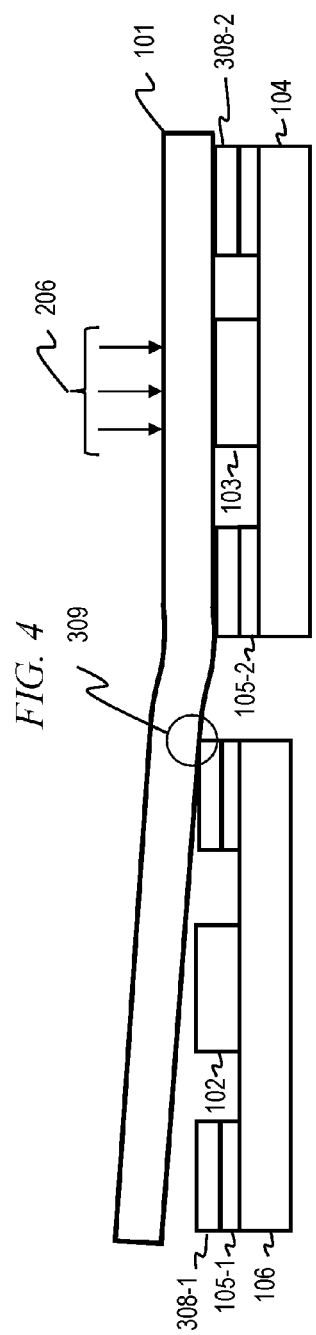

In the inventive system of FIGS. 4 and 5, a mechanically compliant layer 308-1, 308-2 is added, either on top of module stiffeners 105-1, 105-2 as shown or potentially directly contacting modules 104, 106. This compliant layer 308-1, 308-2 absorbs some fraction of the global force inequality at location 309. Because of newly added compliant layer 308-1, 308-2, when force 206 is applied on the right-hand side, instead of point contact on the heat source 102 at 207, the force is reacted out at 309; the force that will develop is lower because of the compliant material and/or will be spread out over a greater area. Silicon chips that typically comprise heat sources such as 102, 103 are made of fragile and brittle material and there are internal structures that can be easily damaged.

Figure 6:
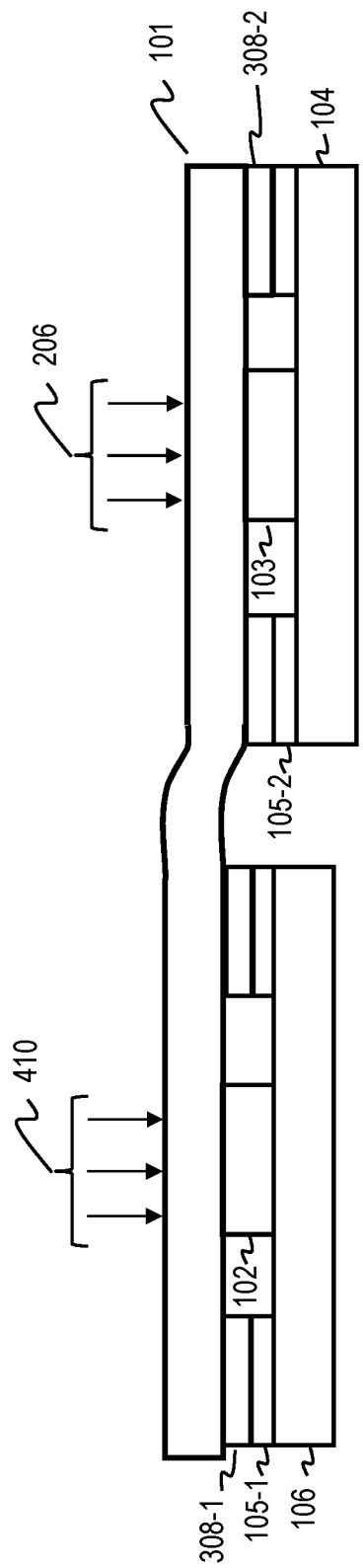
FIG. 6 shows how the problem encountered in assembling the prior-art elements of FIGS. 1 and 2 is reduced or eliminated with the inventive elements of FIGS. 4 and 5.

As seen in FIG. 6, when force 410 is applied in the region of the second heat source 102, the mechanically compliant layer 308-1 protects the heat source 102, resulting in a much more even transfer of force from the thermal sink 101 to heat source 102.

Material 308 can include, for example, a compliant material such as a polymer material like rubber or thermal interface material with polymer base pad. The complaint material may have, for example, a Young's modulus in the range of 0.001 to 0.1 GPa. The thickness of material 308 can be, for example, in the range of 0.1 mm to 1 mm.

The heat sources 102, 103 (in a non-limiting example, chips) may be, for example, from about 5 mm×5 mm to 30 mm×30 mm when viewed in plan (top) view as in FIG. 4, with a thickness from about 0.5 mm to 1 mm when viewed in the side view of FIG. 5. Printed circuit board (PCB) or package substrate 104, 106 may be, for example, in the range of about 20 mm×20 mm to 80 mm×80 mm when viewed in plan (top) view as in FIG. 4. The frame rings 105-1, 105-2 should be close to the package substrate dimension when viewed in plan (top) view as in FIG. 4 (i.e., outer edge of the frame near or coincident with the outer edge of 104, 106), with a width of about 3 mm to 15 mm when viewed in plan (top) view as in FIG. 4 and a thickness less than the heat source thickness when viewed in the side view of FIG. 5.

Thus, one or more embodiments provide a semiconductor module including a substrate, at least one heat source (e.g., a semiconductor die), and a heat source-side (e.g., die-side) support member composed at least in part of a compressible material. The nominal height (i.e., prior to compression) of the support member (compliant material plus frame ring if present) is, in at least some instances, higher than that of the heat source (e.g., die). As noted, the compressible material is, in at least some instances, an elastomer; it may exhibit compression set behavior.

Furthermore, one or more embodiments provide a system including a semiconductor module as just described above and a heat removal component disposed above the heat source (e.g., die) and in contact with the compressible material.

Given the discussion thus far, it will be appreciated that, in general terms, an exemplary method includes the step of providing a heat source 102 on a first side of a substrate 106. The substrate has, on the first side, a support member including a compressible material (frame 105-1 plus compressible material 308-1, or just compressible material 308-1 directly on substrate 106, in an alternate approach).

The heat source includes either a single semiconductor chip or a group of closely spaced semiconductor chips of similar height. As used herein, a group of semiconductor chips are defined as being "closely spaced" and of "similar height" when they are close enough together when viewed in plan (top) view and of sufficiently similar height when viewed in side view that a heat removal component assembled to the group of closely spaced semiconductor chips of similar height will not result in a damaging global inequality of force such as seen in FIG. 3. This will vary depending on the type of chips, mounting, heat removal component, thermal interface material, and assembly techniques used; however, it is definite and ascertainable by the skilled artisan using modern structural analysis techniques (e.g., finite element software such as ANSYS software available from ANSYS, Inc. of Canonsburg, Pa., USA or MSC NASTRAN software available from MSC Software Corporation, Newport Beach, Calif., USA). In one or more embodiments, "closely spaced" would typically be spacing in the range of 0-5 mm, and "of similar height" would typically be height difference in the range of 0-100 micrometers.

A further step, as best seen in FIG. 5, includes bringing into proximity of the heat source a heat removal component 101, oriented at an angle to the heat source 102, such that the heat removal component 101 contacts the support member including the compressible material 105-1 (at 309) prior to contacting the heat source 102. Since the heat removal component 101 may likely deflect slightly, "oriented at an angle" means that the lower face of the heat removal component 101 is locally not parallel to the upper face of the heat source 102.

An even further step, best seen in FIGS. 5 and 6, includes assembling the heat removal component 101 to the heat source 102 such that the support member including the compressible material at least partially absorbs global inequality of force that would otherwise be applied to the heat source, absent the support member including the compressible material.

In some instances, in the providing step, the compressible material has a Young's modulus from 0.001 to 0.1 GPa and a thickness from 0.1 mm to 1 mm, and the assembling includes compressively deflecting the compressible material.

In some instances, the heat source 102 includes a first heat source, and in the bringing into proximity step, the heat removal component 101 is also brought into proximity with a second heat source 103 which is vertically misaligned with the first heat source, causing the heat removal component to be oriented at the angle to the first heat source. The second heat source includes a single semiconductor chip or a group of closely spaced semiconductor chips of similar height. Of course, the chip or chips of the second heat source are different chip(s) than the chip or chips of the first heat source (but they could be the same kind of chip(s)).

In some cases, in the providing step, the compressible material is higher than the heat source, prior to the assembling (but will compress to essentially the same height as the die, once assembled).

In another aspect, an exemplary semiconductor module includes a substrate 106 having a first side; a heat source 102 on the first side of the substrate; and a support member including a compressible material (frame 105-1 plus compressible material 308-1, or just compressible material 308-1 directly on substrate 106, in an alternate approach), located on the first side of the substrate. The heat source includes either a single semiconductor chip or a group of closely spaced semiconductor chips of similar height.

In some instances, the compressible material is configured and dimensioned such that, in an uncompressed condition, it extends beyond the heat source.

The compressible material includes, in some instances, an elastomer.

The compressible material, in some instances, exhibits compression set behavior.

The compressible material, in some instances, has a Young's modulus from 0.001 to 0.1 GPa and a thickness from 0.1 mm to 1 mm.

In still another aspect, an exemplary system includes a semiconductor module of the kind just described and a heat removal component 101, disposed opposite the first side of the substrate and in contact with the compressible material (FIG. 5). In some instances (e.g., FIG. 6), the heat removal component is also in contact with the heat source.

In some instances, the semiconductor module is a first semiconductor module, the heat source is a first heat source, and the substrate is a first substrate, and the system further includes a second semiconductor module, in turn including a second substrate 104 having a first side, and a second heat source 103, which is vertically misaligned with the first heat source. The second heat source is on the first side of the second substrate. The heat removal component is also disposed opposite the first side of the second substrate and in contact with second heat source. The second heat source includes a single semiconductor chip or a group of closely spaced semiconductor chips of similar height.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   providing a heat source on a first side of a substrate, said substrate having on said first side a support member comprising a compressible material, said heat source comprising one of:
      a single semiconductor chip; and
      a group of closely spaced semiconductor chips of similar height;
   bringing into proximity of said heat source a heat removal component, oriented at an angle to said heat source, such that said heat removal component contacts said support member comprising said compressible material prior to contacting said heat source; and
   assembling said heat removal component to said heat source such that said support member comprising said compressible material at least partially absorbs global inequality of force that would otherwise be applied to said heat source, absent said support member comprising said compressible material, wherein:
   said heat source comprises a first heat source;
   in said bringing into proximity step, said heat removal component is also brought into proximity with a second heat source which is vertically misaligned with said first heat source, causing said heat removal component to be oriented at said angle to said first heat source, said second heat source comprising one of:
      a single semiconductor chip; and
      a group of closely spaced semiconductor chips of similar height.

2. The method of claim 1, wherein, in said providing step, said compressible material has a Young's modulus from 0.001 to 0.1 GPa and a thickness from 0.1 mm to 1 mm, and wherein said assembling includes compressively deflecting said compressible material.

3. A method comprising:
   providing a heat source on a first side of a substrate, said substrate having on said first side a support member comprising a compressible material, said heat source comprising one of:
      a single semiconductor chip; and
      a group of closely spaced semiconductor chips of similar height;
   bringing into proximity of said heat source a heat removal component, oriented at an angle to said heat source, such that said heat removal component contacts said support member comprising said compressible material prior to contacting said heat source; and
   assembling said heat removal component to said heat source such that said support member comprising said compressible material at least partially absorbs global inequality of force that would otherwise be applied to said heat source, absent said support member comprising said compressible material, wherein, in said providing step, said compressible material is higher than said heat source, prior to said assembling.

4. A system comprising:
   a semiconductor module comprising:
      a substrate having a first side;
      a heat source on said first side of said substrate; and
      a support member, comprising a compressible material, located on said first side of said substrate, said heat source comprising one of:
         a single semiconductor chip; and
         a group of closely spaced semiconductor chips of similar height; and
      a heat removal component, disposed opposite said first side of said substrate and in contact with said compressible material, wherein said semiconductor module comprises a first semiconductor module, said heat source comprises a first heat source, and said substrate comprises a first substrate, further comprising:
         a second semiconductor module comprising:
            a second substrate having a first side; and
            a second heat source, which is vertically misaligned with said first heat source, said second heat source being on said first side of said second substrate, said second heat source comprising one of:
               a single semiconductor chip; and
               a group of closely spaced semiconductor chips of similar height;
         wherein said heat removal component is also disposed opposite said first side of said second substrate and in contact with second heat source.

5. The system of claim 4, wherein said heat removal component is also in contact with said heat source.

6. The system of claim 4, wherein said compressible material is configured and dimensioned such that, in an uncompressed condition, it extends beyond said heat source.

7. The system of claim 4, wherein said compressible material comprises an elastomer.

8. The system of claim 4, wherein said compressible material exhibits compression set behavior.

9. The system of claim 4, wherein said compressible material has a Young's modulus from 0.001 to 0.1 GPa and a thickness from 0.1 mm to 1 mm.

* * * * *